US010581003B2

(12) United States Patent
Melosh et al.

(10) Patent No.: US 10,581,003 B2
(45) Date of Patent: Mar. 3, 2020

(54) METHOD FOR LITHOGRAGHIC PATTERNING OF SENSITIVE MATERIALS

(71) Applicant: The Board of Trustees of the Leland Stanford Junior University, Stanford, CA (US)

(72) Inventors: Nicholas Alexander Melosh, Menlo Park, CA (US); Matt R. Angle, Stanford, CA (US); Mina-elraheb S. Hanna, Stanford, CA (US); Yifan Kong, Stanford, CA (US)

(73) Assignee: The Board of Trustee of the Leland Stanford Junior Universtiy, Stanford, CA (US)

(*) Notice: Subject to any disclaimer, the term of this patent is extended or adjusted under 35 U.S.C. 154(b) by 0 days.

(21) Appl. No.: 16/329,947

(22) PCT Filed: Sep. 1, 2017

(86) PCT No.: PCT/US2017/049847
§ 371 (c)(1),
(2) Date: Mar. 1, 2019

(87) PCT Pub. No.: WO2018/048742
PCT Pub. Date: Mar. 15, 2018

(65) Prior Publication Data
US 2019/0198785 A1 Jun. 27, 2019

Related U.S. Application Data

(60) Provisional application No. 62/383,096, filed on Sep. 2, 2016.

(51) Int. Cl.
*H01L 51/05* (2006.01)
*H01L 51/00* (2006.01)
(Continued)

(52) U.S. Cl.
CPC ............ *H01L 51/0558* (2013.01); *G03F 7/40* (2013.01); *G03F 7/422* (2013.01);
(Continued)

(58) Field of Classification Search
CPC ............ H01L 51/0558; H01L 51/0043; H01L 51/0037; H01L 51/102; H01L 51/0541;
(Continued)

(56) References Cited

U.S. PATENT DOCUMENTS 7,160,771 B2   1/2007  Chou et al.
8,652,339 B1   2/2014  Meyer et al.
(Continued)

FOREIGN PATENT DOCUMENTS

EP   0076215 A2   4/1983
EP   1510861 A1   3/2005
EP   3037880 A1   8/2014

OTHER PUBLICATIONS

R. N. Orth et al., "Creating Biological Membranes on the Micron Scale: Forming Patterned Lipid Bilayers Using a Polymer Lift-Off Technique", "Biophysical Journal", Nov. 1, 2003, Publisher: Elsevier B.V., 3066-3073, vol. 85, Issue 5.
(Continued)

*Primary Examiner* — Kyoung Lee
(74) *Attorney, Agent, or Firm* — Kaplan Breyer Schwarz, LLP

(57) ABSTRACT

Methods for patterning highly sensitive materials, such as organic materials, organic semiconductors, biomolecular materials, and the like, with photolithographic resolution are disclosed. In some embodiments, a germanium mask (304) is formed on the surface of the sensitive material (302), thereby protecting it from subsequent processes that employ harsh chemicals that would otherwise destroy the sensitive material (302). A microlithography mask (306) is patterned
(Continued)

on the germanium mask layer (304), after which the germanium exposed by the microlithography mask (306) is removed by dissolving it in water. After transferring the pattern of the germanium mask (304) into the sensitive material (302), the germanium and microlithography masks (304, 306) are completely removed by immersing the substrate in water, which dissolves the remaining germanium and lifts off the microlithography mask material. As a result, the only chemical to which the sensitive material (302) is exposed during the patterning process is water, thereby mitigating or avoiding damage to the material (302).

25 Claims, 11 Drawing Sheets

(51) Int. Cl.
G03F 7/40 (2006.01)
G03F 7/42 (2006.01)
H01L 51/10 (2006.01)

(52) U.S. Cl.
CPC ...... *H01L 51/0016* (2013.01); *H01L 51/0018* (2013.01); *H01L 51/0037* (2013.01); *H01L 51/0043* (2013.01); *H01L 51/0541* (2013.01); *H01L 51/102* (2013.01)

(58) Field of Classification Search
CPC . H01L 51/0018; H01L 51/0016; G03F 7/422; G03F 7/40
See application file for complete search history.

(56) References Cited

U.S. PATENT DOCUMENTS

| 8,679,976 | B2 | 3/2014 | Lee et al. |
| 8,846,522 | B2 | 9/2014 | Vrtis et al. |
| 2009/0081595 | A1* | 3/2009 | Hatakeyama ......... G03F 7/0397 430/323 |
| 2012/0141700 | A1 | 6/2012 | Choi et al. |

OTHER PUBLICATIONS

Gang Wang et al., "Direct Growth of Graphene Film on Germanium Substrate", "Scientific Reports", Aug. 19, 2013, DOI: 10.1038/srep02465, 6 pp., 3 : 2465.
Authorized Officer: Bakos, Tamas, International Search Report and Written Opinion issued in PCT patent application No. PCT/US2017/049847, dated Dec. 21, 2017, 15 pp.

* cited by examiner

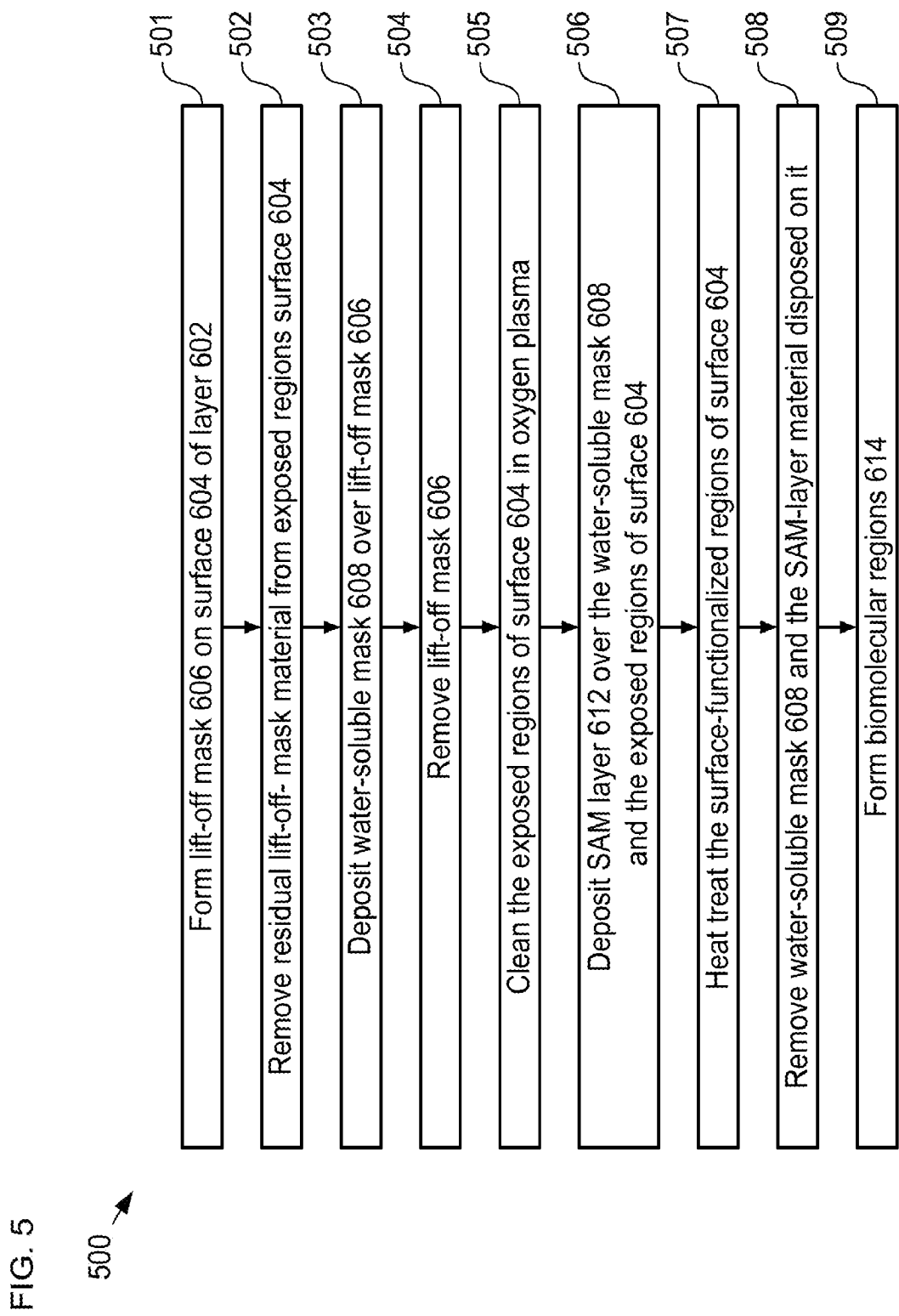

METHOD FOR LITHOGRAGHIC PATTERNING OF SENSITIVE MATERIALS

STATEMENT OF RELATED CASES

This case claims priority to U.S. Provisional Patent Application Ser. No. 62/383,096, filed Sep. 2, 2016, which is incorporated herein by reference.

STATEMENT REGARDING FEDERALLY SPONSORED RESEARCH

This invention was made with Government support under contract DE-AC02-76SF00515 awarded by the Department of Energy. The Government has certain rights in the invention.

FIELD OF THE INVENTION

The present invention relates to the patterning of organic materials in general, and, more particularly, to sub-micron patterning of organic materials.

BACKGROUND OF THE INVENTION

Organic materials, such as organic semiconductors, have become important materials in many microelectronic applications—from high-performance electronics systems to flat-panel displays based on organic-light-emitting-diodes (OLEDs).

Unfortunately, organic materials are exemplary of a class of sensitive materials that are difficult to pattern photolithographically due to the fact that they are incompatible with many of the required chemicals. As a result, alternative patterning methods have been developed for such sensitive materials, such as stamp-based lithography, direct patterning via deposition through a shadow mask, and special ultraviolet active systems used in multistage patterning approaches. In some applications, such as OLED manufacture, shadow-mask-based patterning has become the de facto standard. Feature sizes obtainable using shadow mask patterning are typically limited to relatively large dimensions (e.g., several microns to tens of microns), however, due to the fact that the deposited material tends to spread laterally after passing through the shadow mask-referred to as "feathering." Furthermore, stamp-based lithography and active approaches have been difficult to scale and remain somewhat unreliable.

In the hope of enabling integration into mainstream integrated-circuit manufacturing, alternative approaches, such as photoresists based on fluorinated solvents have been explored. Unfortunately, fluorinated resists still suffer from significant limitations in feature resolution, as well as other issues.

Feature size remains a limiting factor in the development of practical approaches to the fabrication of many organic-material-based devices. For example, an organic electrochemical transistor (OECT) requires a very small gate length to achieve fast device speeds, while high-resolution OLED displays require large arrays of densely packed, very small light-emitting regions.

The need for a practical method for patterning sensitive materials with fine, preferably sub-micron, dimensions remains, as yet, unmet in the prior art. The development of such a method would unlock the potential for many sensitive materials, such as organic materials, organic semiconductors, biomolecular materials, and the like, across many application areas.

SUMMARY OF THE INVENTION

The present invention enables patterning of sensitive materials, such as organic materials, organic semiconductors, biomolecular materials, and lipids, with sub-micron features by avoiding exposure of the sensitive material to the harsh chemical environment associated with conventional photolithography. The present invention exploits the fact that germanium can be patterned with sub-micron features and that it is soluble in water, thereby enabling its use as a mask material for sensitive materials-without requiring exposure of the sensitive material any chemical other than water. Further, since germanium can be deposited with low energy during evaporation, a germanium mask layer can be formed directly on sensitive material without inducing thermal degradation.

An illustrative embodiment of the present invention is a method for forming an OECT, where the organic semiconductor layer of the structure is protected by a germanium layer while it is patterned using conventional photolithography and etching. Once the organic semiconductor patterning operations are concluded, the germanium and photoresist mask are removed in water, thereby avoiding exposure of the organic material to harsh solvents.

In some embodiments, an organic-material layer is patterned using a lift-off process in which a germanium layer is patterned to expose regions of an underlying surface. The organic material is then deposited over the patterned germanium layer, after which, the germanium layer is dissolved in water to remove it and the organic material disposed upon it.

In some embodiments, a germanium lift-off process is used to selectively deposit self-assembled monolayers on a mica or silicon-based surface to functionalize the surface in preparation for binding biomolecules.

An embodiment of the present invention is a method for forming a device that includes an organic-material layer having a first pattern, the method comprising: defining the first pattern in a first layer comprising a first material that includes germanium; transferring the first pattern into a second layer comprising a second material that includes the organic material; and removing the first layer by dissolving it in water.

Another embodiment of the present invention is a method for forming a device that includes an organic-material layer having a first pattern, the method comprising: providing a substrate having a dielectric layer that comprises a first surface; forming first and second electrodes on the first surface, wherein the first and second electrodes are separated by a gap; forming a first layer comprising a first material that includes the organic material, wherein the first layer is formed such that the first material resides within the gap; forming a second layer comprising a second material that includes germanium; patterning the second layer to define a second pattern; transferring the second pattern into the first layer, wherein the transfer of the second pattern into the first layer defines the first pattern in the first layer; and removing the second material by exposing it to water.

BRIEF DESCRIPTION OF THE DRAWINGS

FIG. 5 depicts operations of a method suitable for forming biomolecule regions on a surface of a substrate.

DETAILED DESCRIPTION

Figure 1A:
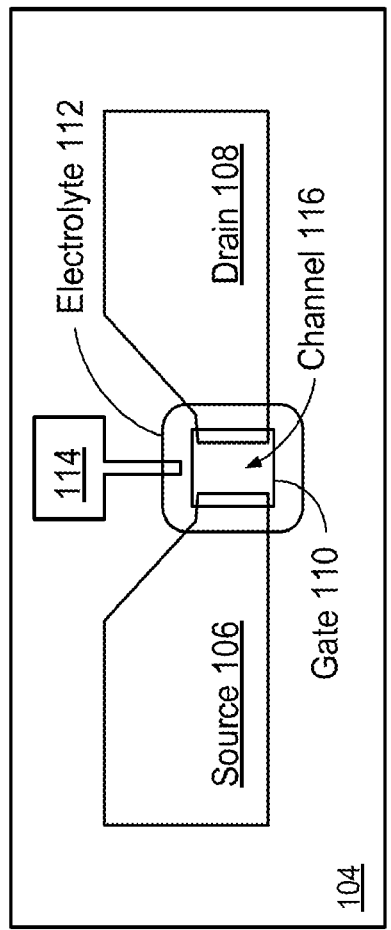
FIGS. 1A and 1B depict schematic drawings of top and cross-sectional views, respectively, of an OECT formed via a fabrication process in accordance with the present invention.
Figure 1B:
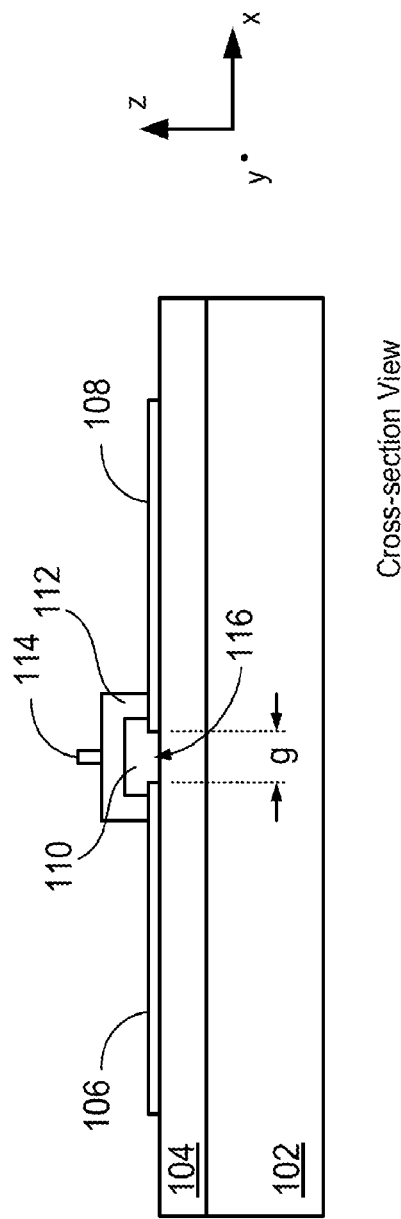

FIGS. 1A and 1B depict schematic drawings of top and cross-sectional views, respectively, of an organic-semiconductor device formed via a fabrication process in accordance with the present invention. Device 100 is an organic electrochemical transistor that includes substrate 102, dielectric layer 104, source 106, drain 108, gate 110, electrolyte 112, and gate electrode 114.

Figure 1C:
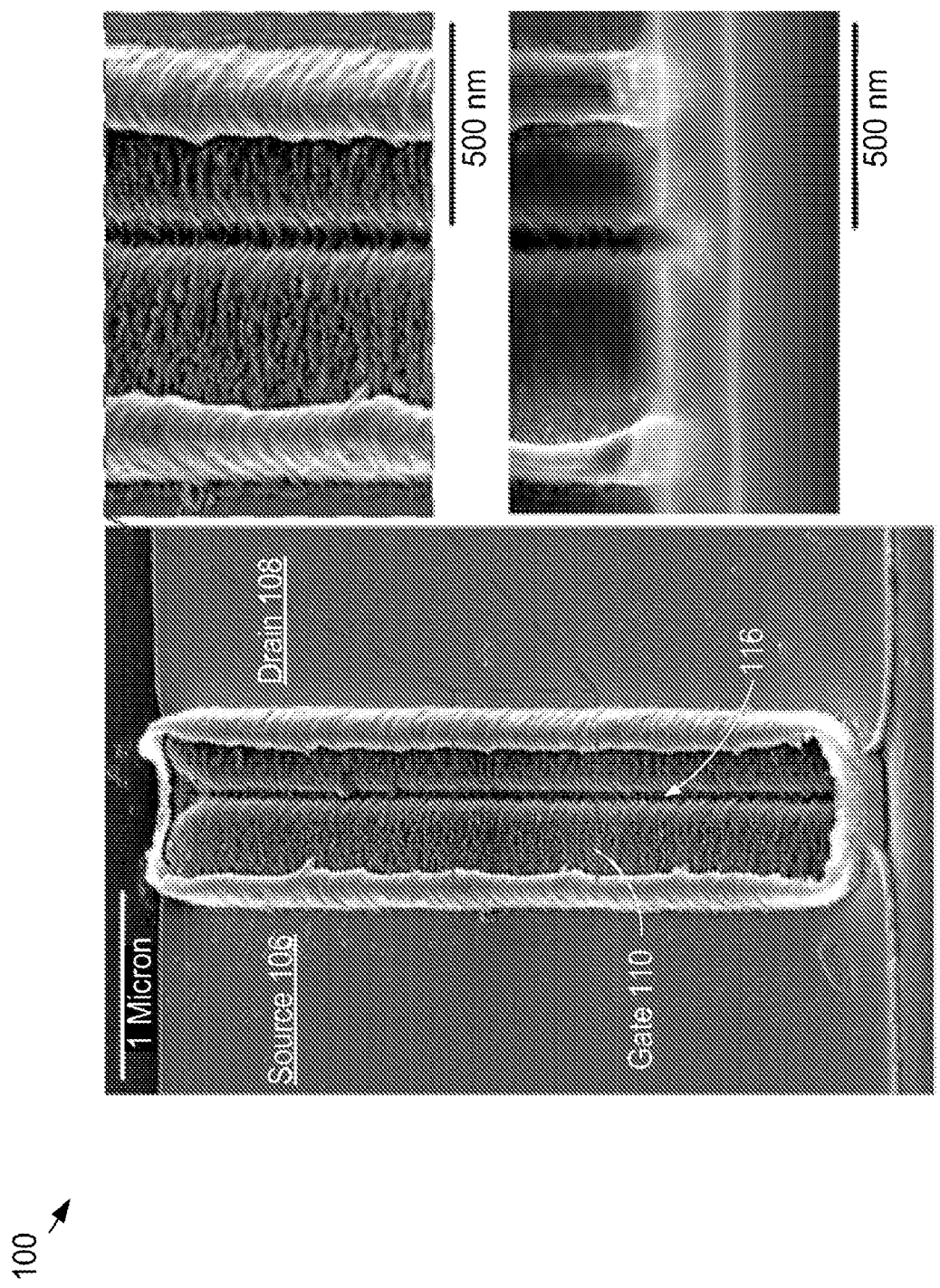
FIG. 1C depicts photographs of a portion of device 100 at different magnifications.

FIG. 1C depicts photographs of a portion of device 100 at different magnification scales.

An organic electrochemical transistor, such as device 100, is a special type of electrolyte-gated transistor (EGT). EGTs are attractive for use in sensing applications not only due to their low turn-on voltage and relatively high transconductance, but also because they can be miniaturized using substantially standard fabrication processes. The device structure of an EGT is analogous to that of a regular field effect transistor (FET); however, in an EGT, the solid insulating layer of the conventional FET is replaced by an electrolyte that can be solid, gel or liquid. OECTs are particularly well suited for sensing applications because they can support both ionic and electronic transport, as well as transduce ion flux into electrical signals with high gain.

Figure 2:
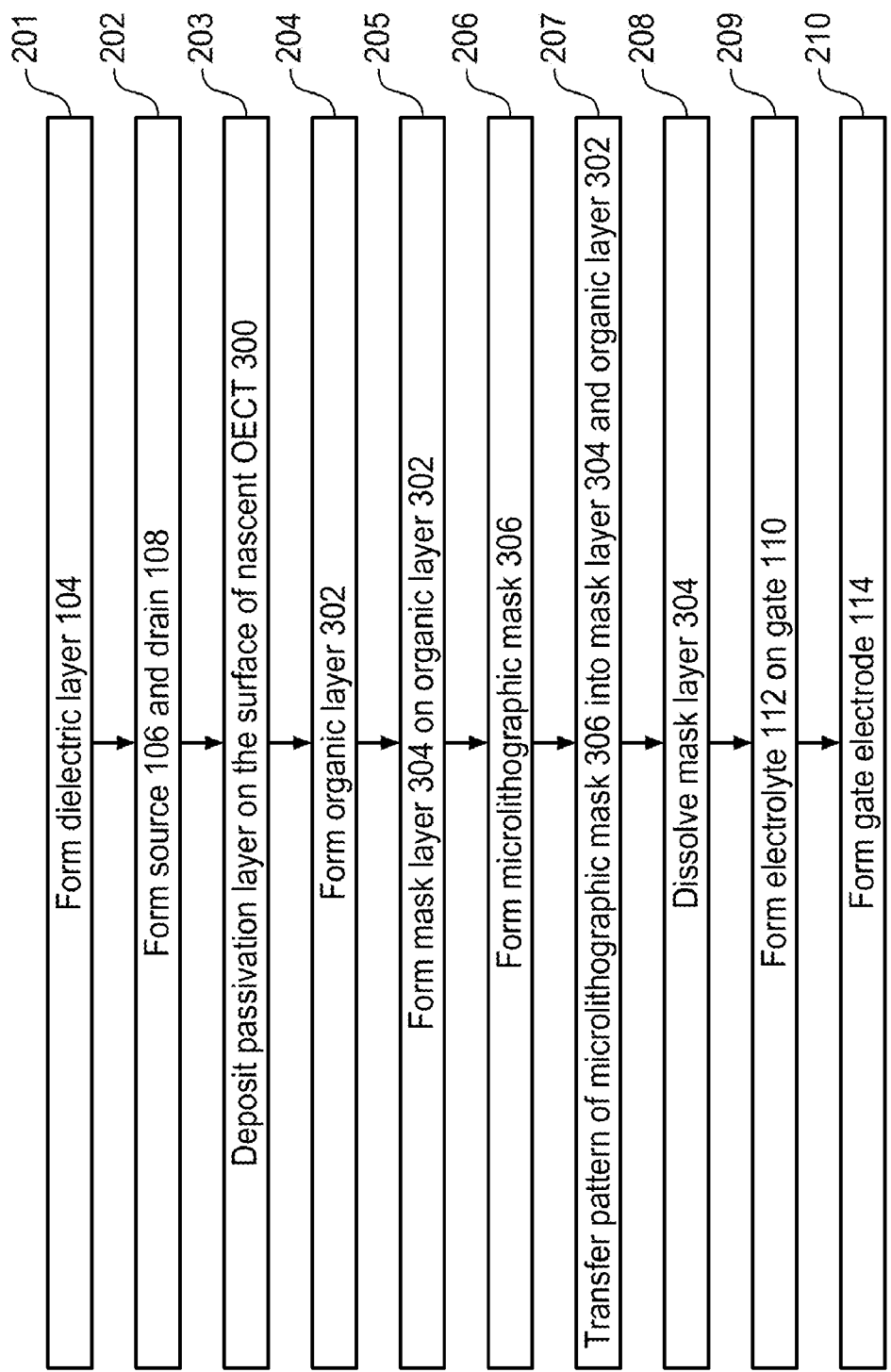
FIG. 2 depicts operations of a method suitable for forming device 100.

FIG. 2 depicts operations of a method suitable for forming device 100.

Figure 3A:
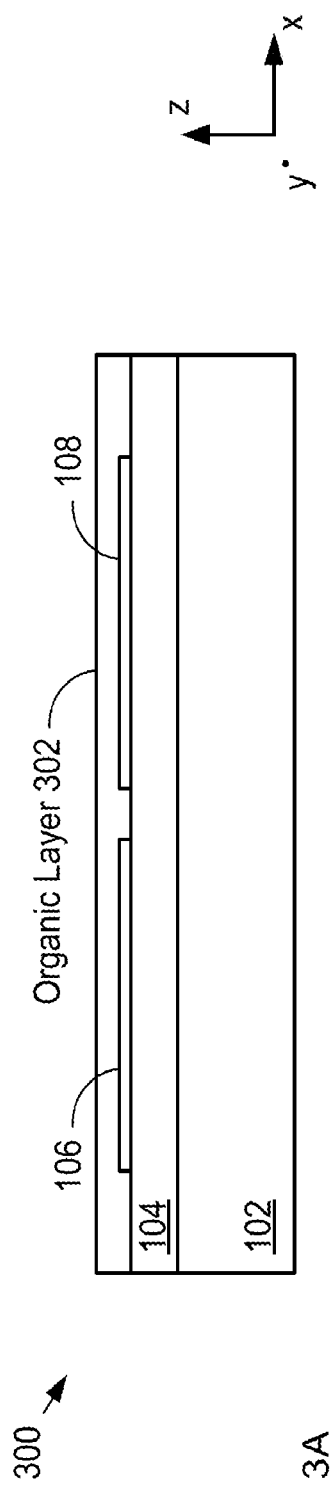
FIGS. 3A-C depict cross-sectional views of device 100 at different points in its fabrication.
Figure 3B:
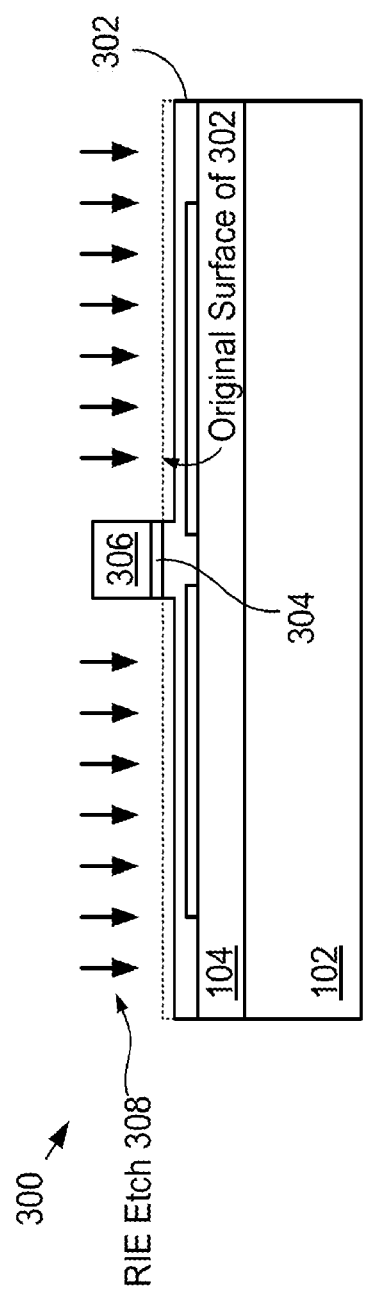
Figure 3C:
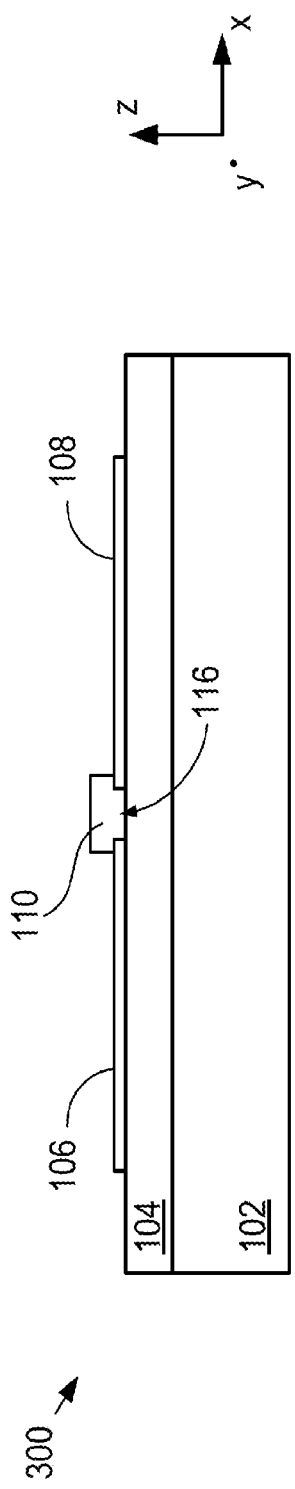

FIGS. 3A-C depict cross-sectional views of a nascent OECT at different points in its fabrication in accordance with the illustrative embodiment of the present invention.

Method 200 is described with continuing reference to FIGS. 1A-B and FIGS. 3A-C. Method 200 begins with operation 201, wherein dielectric layer 104 is formed on substrate 102.

Substrate 102 is a conventional planar-processing substrate suitable for use as in the formation of device 100. In the depicted example, substrate 102 is a single-crystal silicon substrate; however, other materials can be used for substrate 102, such as other silicon-based semiconductors (e.g., silicon carbide, silicon germanium, etc.), III-V semiconductors (e.g., gallium arsenide, indium phosphide, and their compounds, such as gallium-indium-arsenide-phosphide, etc.), II-VI semiconductors, and the like.

Dielectric layer 104 is formed by thermally oxidizing substrate 102 to form a silicon dioxide layer having a suitable thickness. In the depicted example, dielectric layer 104 is a layer of silicon dioxide that has a thickness of approximately 1 micron; however, other thicknesses and/or materials can be used without departing from the scope of the present invention.

At operation 202, source 106 and drain 108 are formed on dielectric layer 104.

Source 106 and drain 108 are electrodes formed on dielectric layer 104 via conventional lift-off patterning. In some embodiments, at least one of the source and drain is formed by subtractive patterning.

In the depicted example, each of source 106 and drain 108 comprises a layer of palladium disposed on a layer of titanium, where the layers have thicknesses of 60 nm and 5 nm, respectively. In some embodiments, at least one of source 106 and drain 108 comprises a different electrically conductive material.

Source 106 and drain 108 are separated by gap, g, which defines the length and width of the channel of the transistor. In the depicted example, device 100 has a channel length of approximately 500 nm and a channel width of approximately 6.6 microns.

At operation 203, a passivation layer is formed to passivate all exposed surface. In the depicted example, the passivation layer comprises a layer of alumina having a thickness of approximately 32 nm, where the layer of alumina is deposited via atomic-layer deposition (ALD); however, other materials, layer thicknesses, and/or deposition methods can be used for the passivation layer without departing from the scope of the present invention.

At operation 204, organic layer 302 is formed on the top surface of the nascent OECT structure. Organic layer 302 comprises poly(3,4-ethylenedioxythiophene): poly(styrenesulfonate) (normally referred to as PEDOT:PSS). In the depicted example, organic layer 302 is formed via spin-coating; however, other conventional processes, such as vapor coating, etc., can be used to form organic layer 302 without departing from the scope of the present invention.

The use of PEDOT:PSS in organic layer 302 is particularly attractive for embodiments of the present invention wherein device 100 is an OECT. PEDOT:PSS is a p-type semiconductor and readily uptakes ions due to its morphological characteristics. In a PEDOT:PSS-based OECT, with no potential applied to its gate, a high drain-source current can be observed (i.e., its channel is ON). This high current arises from holes on the PEDOT chains that are compensating the sulfonate anions presented in the PSS chain. Upon application of a positive gate voltage, cations are injected into the solid PEDOT:PSS film. These positive ions compensate the sulfonate groups, depleting the holes which are then extracted by the contacts, lowering the channel conductivity. By moving enough cations into the polymer, the channel can be eventually turned OFF completely. This ability of transducing ionic flux into electronic current is very welcome, especially for sensing and biosensing applications.

While in the illustrative embodiment, organic layer 302 comprises PEDOT:PSS, it will be clear to one skilled in the art, after reading this Specification, how to specify, make, and use alternative embodiments that comprise one or more different organic materials. For example, in embodiments of the present invention including one or more OLEDs, organic layer 302 might comprise any of myriad organic light-emitting materials, such as organometallic chelates, fluorescent dyes, phosphorescent dyes, conjugated dendrimers, and the like.

FIG. 3A shows nascent OECT 300 after the formation of organic layer 302. Note that, for clarity, the alumina passivation layer is not shown.

At operation 205, mask layer 304 is formed on organic layer 302. In the depicted example, mask layer 304 is a layer of germanium having a thickness of approximately 100 nm.

At operation 206, microlithographic mask 306 is formed on mask layer 304 in conventional fashion. In operation 206 of the depicted example, microlithographic mask 306 is formed by depositing a layer of liquid photoresist on mask layer 304, typically by spin coating methods. The liquid photoresist is then heated slightly to "soft bake" it, creating a soft, substantially solid layer. Once soft baked, the photoresist layer is exposed to a pattern of ultraviolet light, which exposes those regions of photoresist to be removed. After exposure, the photoresist layer is immersed in a development solution, which is strongly basic. The development solution dissolves the regions of photoresist that were exposed to the UV light, while leaving behind those regions that were unexposed. These remaining photoresist regions function as an etch mask for the germanium of mask layer 304. Although microlithographic mask 306 comprises a photoresist in the illustrative embodiment, it will be clear to one skilled in the art, after reading this Specification, how to specify, make, and use alternative embodiments of the present invention wherein microlithographic mask 306 comprises a different material, such as e-beam resist, photodefinable polyimide, and the like. Furthermore, in some embodiments, microlithographic mask 306 is formed via a process other than photolithography, such as imprint lithography, laser-ablation, etc.

It should be noted that the strongly basic chemistry of typical photoresist developer solution would catastrophically damage any portion of organic layer 302 exposed to it. It is an aspect of the present invention, however, that the formation of germanium-based mask layer 304 on the organic material protects the organic material from attach by the developer solution. Furthermore, as described below, the solubility of germanium in water enables removal of microlithographic mask 306 after its definition without subjecting the organic material to any other harsh chemical environments. The present invention, therefore, enables definition of features having photolithographically definable dimensions, which are typically much smaller than can be defined using prior-art methods, such as shadow-mask patterning.

At operation 207, nascent OECT 300 is etched in reactive-ion etch (RIE etch) 308 to transfer the pattern of microlithographic mask 306 into both mask layer 304 and organic layer 302 to define gate 110. One skilled in the art will recognize that the portion of gate 110 that resides between source 106 and drain 108 defines channel 116.

FIG. 3B depicts nascent OECT 300 during the RIE process of operation 207.

At operation 208, nascent OECT 300 is immersed in water, which dissolves the remaining germanium of mask 304, thereby lifting off and removing microlithographic mask 306.

FIG. 3C depicts nascent OECT 300 after removal of mask layers 304 and 306.

At operation 209, electrolyte 112 is formed on gate 110. Electrolyte 112 comprises a well of polydimethylsiloxane (PDMS), which is formed on nascent OECT 300 such that gate 110 is imbibed in 0.1 M sodium chloride/water solution.

At operation 210, gate electrode 114 is formed such that it is partially immersed in electrolyte 112. In the depicted example, gate electrode 114 comprises a pellet of silver and silver chloride (i.e., Ag/AgCl); however, other gate electrode structures and/or materials can be used within the scope of the present invention.

While OECTs interfaced with ionic barriers or other biological systems promise exceptional next-generation biosensors and other diagnostic tools, prior-art OECTs have failed to live up to that promise. To date, the fastest conventional OECT reported has a switching speed of approximately 10 kHz. Unfortunately, for many applications, such as interfacing with neurons and muscle cells that have action potential duration on the order of a few milliseconds, such switching speeds are insufficient. The present invention, however, enables improvement in device transconductance, as well as improved switching speed between the On and OFF states.

Figure 4A:
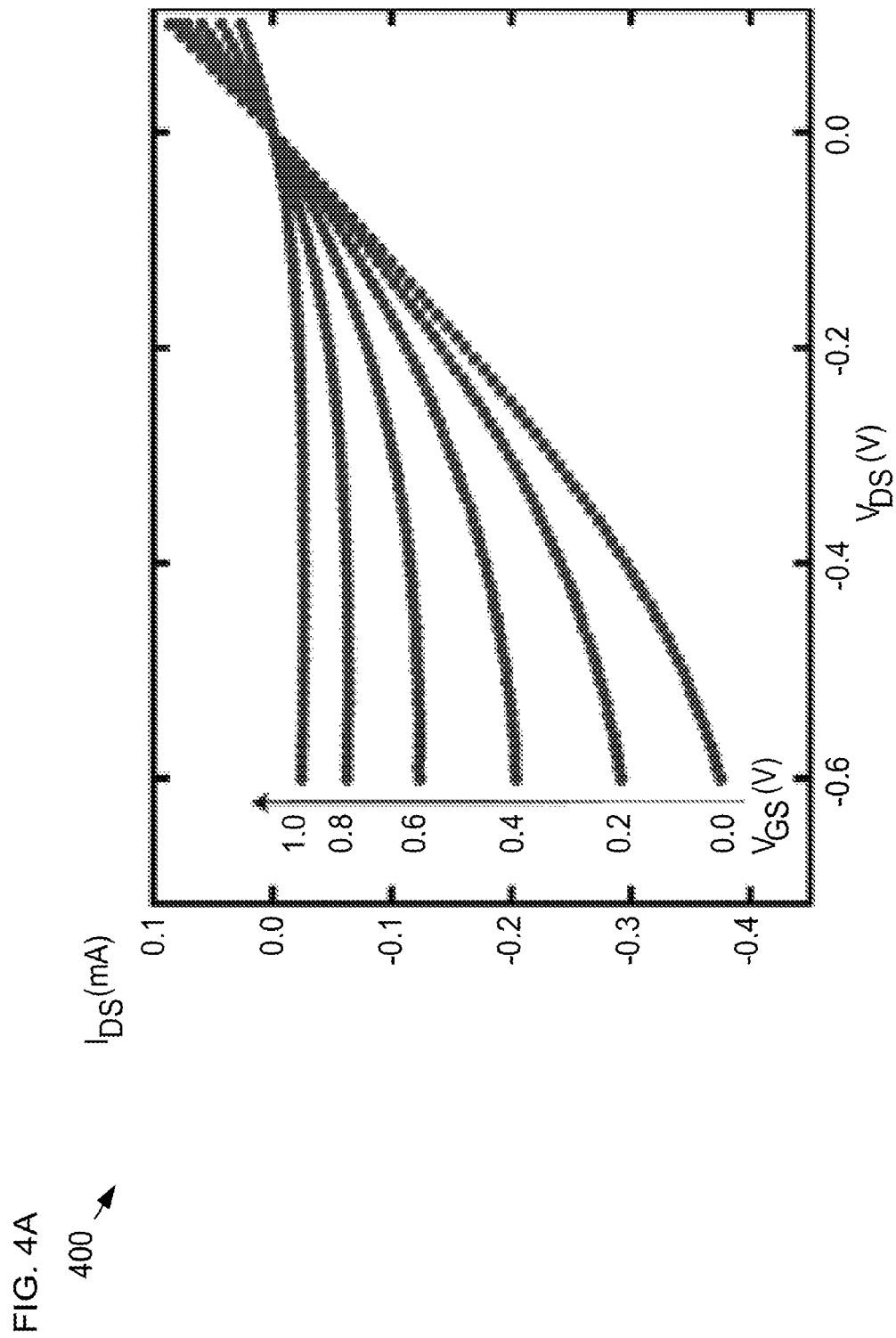
FIG. 4A shows the output characteristics measurement of device 100.

FIG. 4A shows the output characteristics measurement of device 100. Plot 400 demonstrates that a positive bias gate electrode 114 reduces the current flow through channel 116 by dedoping the PEDOT:PSS resulting in depletion-mode operation of the OECT. A maximum transconductance, $g_{m,max}$, of 0.44 mS at $V_g$=0.2 V was determined from a transfer curve of the device. This is consistent with reported numbers for OECT devices of similar channel size and PEDOT thickness, which shows that organic layer 302 survived the lithographic process without significant degradation.

Figure 4B:
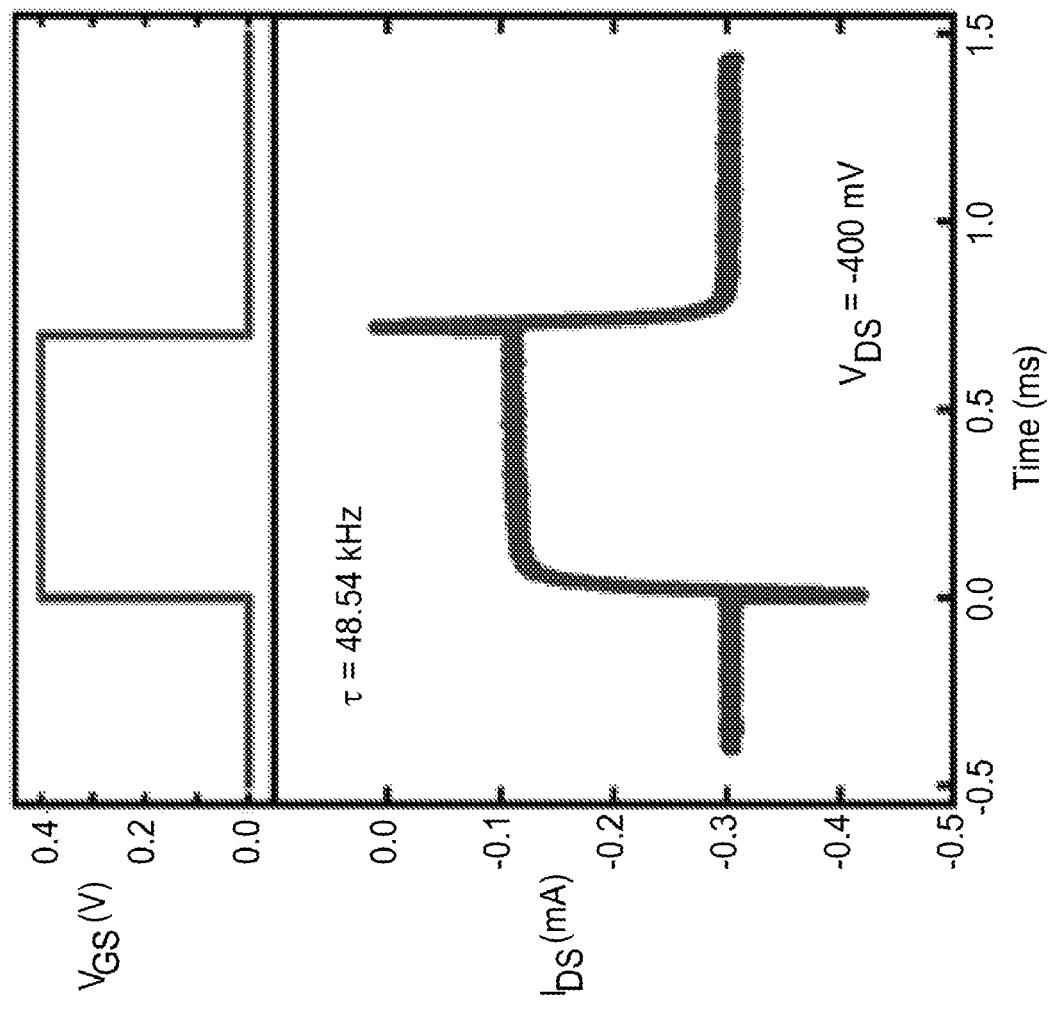
FIG. 4B shows a measurement of the drain-transient curve for device 100.

FIG. 4B shows a measurement of the drain-transient curve for device 100. The drain-transient response was measured by applying a voltage between drain 108 and source 106 (i.e., $V_{DS}$) of −400 mV and applying a pulsed-voltage between gate electrode 114 and source 106 (i.e., $V_{GS}$) of 400 mV. By fitting the curve with a mono-exponential growth, an ON/OFF switching rate of 48.543 kHz was determined. The superior performance of device 100 as compared to prior-art OECTs arises from the miniaturization of the device channel and the film uniformity of organic layer 304, each which is enabled by the present invention.

It should be noted that method 200 demonstrates merely one manner of forming and patterning an organic layer in accordance with the present invention. In some embodiments, for example, germanium mask layer 304 is formed and patterned before the deposition of organic layer 302. After the organic layer is deposited over the patterned germanium layer, the germanium material is dissolved in water, thereby removing all organic material disposed on top of it without damaging any organic material that remains.

It is another aspect of the present invention that the use of such "lift-off" patterning is particularly advantageous for the patterning of highly sensitive biological molecules, such as self-assembled monolayers (SAMs) used to functionalize a surface for attachment of biomolecules (e.g., lipids, organic molecules, biological species, biological cells, polymers, proteins, etc.). Like the organic materials discussed above, patterning of biomolecules is typically difficult, if not impossible, to effect via standard photolithography methods due to the organic solvents, acids and bases used in the development of photoresists. In addition, biological molecules are typically susceptible to radiation damage from the ultraviolet radiation used to expose conventional photoresist. Furthermore, small amounts of photoresist residue after development often contaminates the surface from which it has been removed, rendering it unsuitable for biomolecular functionalization. Germanium, however, is well suited for use in patterning biological layers because it leaves a nearly pristine surface when removed.

To further demonstrate the capability of the present invention, a process for forming lipid bilayers on a functionalized surface is described here. One skilled in the art will recognize that lipid bilayers are two-dimensional fluids that can be easily disrupted or destroyed and are among the most sensitive biomolecule layers. Supported lipid bilayers have been pursued due to their use in studying different cellular membrane components, membrane proteins, and the like. In addition, supported lipid bilayers are also potentially useful as cellular interfaces. Unfortunately, supported lipid bilayers are extremely fragile and do not readily form on anything but the cleanest surfaces. As a result, their formation represents a stringent test of germanium patterning cleanliness and compatibility with ultra-fragile organic systems.

Supported lipid bilayer formation is generally only possible on mica- and silicon-based surfaces such as silica, silicon dioxide, silicon nitride, etc. Rough surfaces retard supported bilayer quality, and inhomogeneity in the surface chemistry can create defective areas. However, patterned lipid surfaces are of great interest to biochemical studies of lipid membrane dynamics and, therefore, the present invention enables advanced patterning methods capable of sub-micron resolution that give rise to new lipid- and bio-patterning-based technologies.

FIG. 5 depicts operations of a method suitable for forming biomolecule regions on a surface of a substrate. Method 500 is described with reference to FIGS. 6A-C, 7, 8, and 9.

Figure 6A:
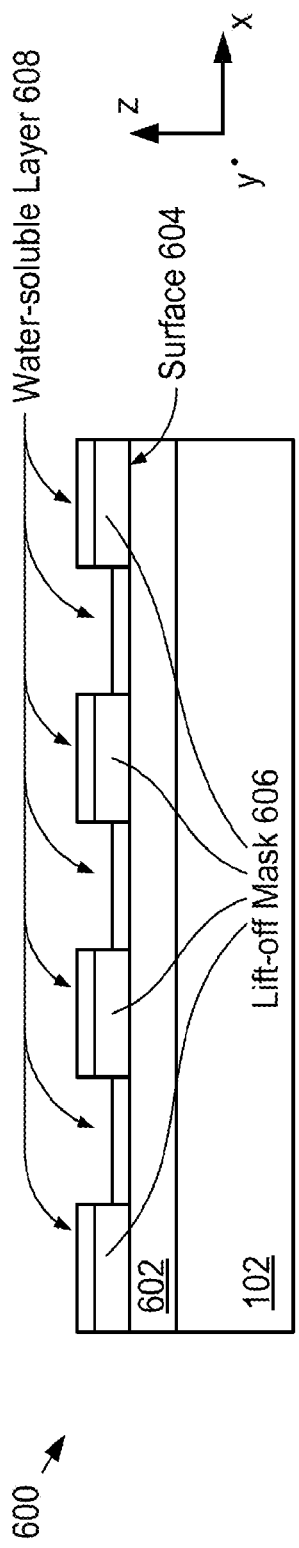
FIGS. 6A-C depicts schematic drawings of cross-sectional views of a surface-functionalized device at different points during the formation of a pattern of biomolecular regions on its surface.
Figure 6B:
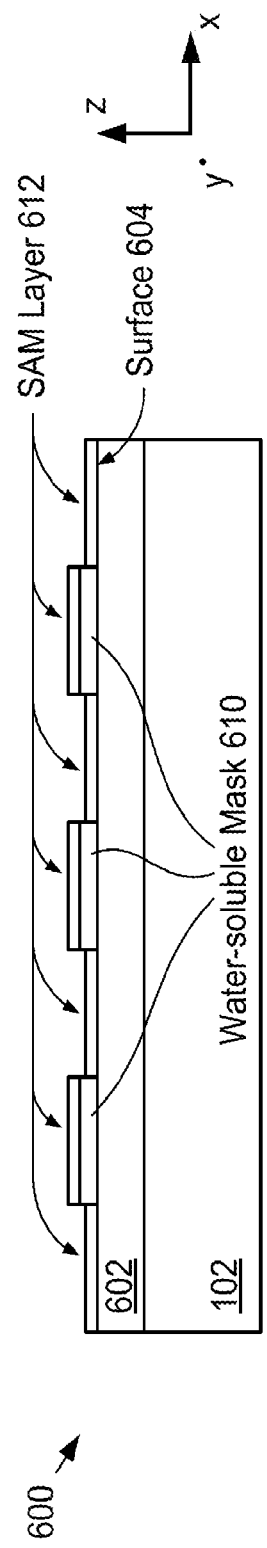
Figure 6C:
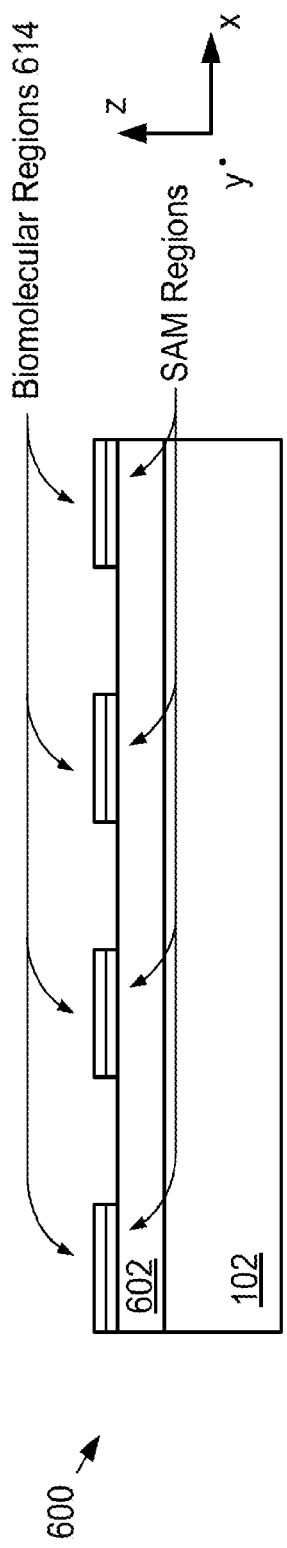

FIGS. 6A-C depicts schematic drawings of cross-sectional views of a surface-functionalized device at different points during the formation of a pattern of biomolecular regions on its surface.

Method 500 begins with operation 501, wherein lift-off mask 606 is formed on surface 604 of layer 602, which is a layer of silica disposed on substrate 102. In the depicted example, lift-off mask 606 is a microlithographic layer comprising a layer of photoresist that is patterned with a first pattern. The first pattern includes photoresist regions only where the deposition of water-soluble mask 608 is not desired and exposes those areas of surface 604 upon which the deposition of water-soluble mask 608 is desired. In other words, transferring the first pattern into water-soluble mask 608 defines a second pattern in the mask that is the inverse of the first pattern.

At operation 502, the exposed regions of surface 604 are treated to ensure no residual material of lift-off mask 606 exists on the exposed region of surface 604. In the depicted example, the exposed surfaces are cleared by exposing them to an oxygen plasma.

At operation 503, water-soluble layer 608 is deposited over lift-off mask 606. In the depicted example, water-soluble layer 608 is a layer of substantially pure germanium; however, in some embodiments, water-soluble layer 608 comprises another germanium-containing material. Water-soluble layer 608 is deposited over the patterned microlithographic layer such that it deposits directly on the exposed regions of the silica surface. In this exemplary process, water-soluble layer 608 has a nominal thickness of 40 nm.

FIG. 6A depicts device 600 after deposition of water-soluble layer 608.

At operation 504, lift-off mask 606 is removed. In the depicted example, the lift-off mask is removed by immersion in acetone for 2 hours, followed by 15 minutes of sonication in acetone. During operation 504, water-soluble layer 608 is converted to water-soluble mask 610.

Figure 7:
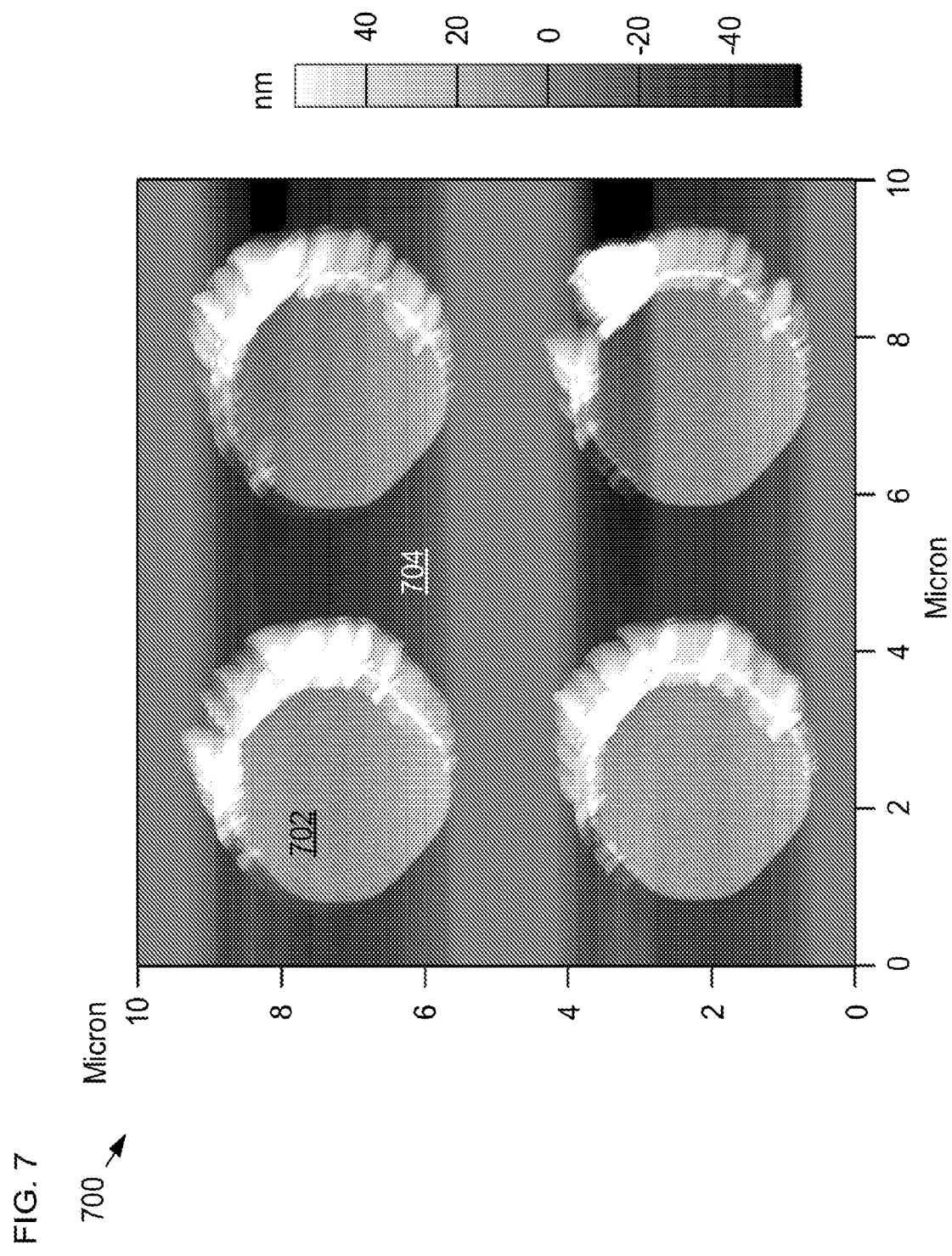
FIG. 7 depicts a top view of a patterned germanium layer on a substrate.

FIG. 7 depicts a top view of a patterned germanium layer on a substrate. Germanium layer 700 includes germanium fields 702 and exposed substrate surface 704. Germanium layer 700 is representative of a layer formed via operations 501 through 505.

At operation 505, device 600 is again exposed to an oxygen plasma to remove any residual photoresist in the regions of surface 602 exposed by water-soluble mask 610.

At operation 506, device 600 is surface functionalized with SAM layer 612 by silanizing surface 604. In the depicted example, surface 604 is silanized via immersion in a solution of dehydrated toluene and 1% volume octadecyltrichlorosilane (OTS) for one hour to deposit, after which, device 600 is rinsed with toluene and blown dry with nitrogen.

At operation 507, the surface-functionalized surface regions are heat treated for 30 minutes at 120° C. on a hot plate. One skilled in the art will recognize that different times/temperatures can be used to heat treat this surface without departing from the scope of the present invention.

FIG. 6B depicts device 600 after formation of SAM layer 612 over water-soluble mask 610.

At operation 508, water-soluble mask 610 is dissolved by immersing device 600 in water, which removes SAM layer 612 everywhere except where the substrate surface had been originally protected by the lift-off mask formed in operation 501. In some embodiments, the water-soluble mask is dissolved by immersing the substrate in dilute hydrogen peroxide (0.3%) and sonicating it for 30 minutes.

Figure 8:
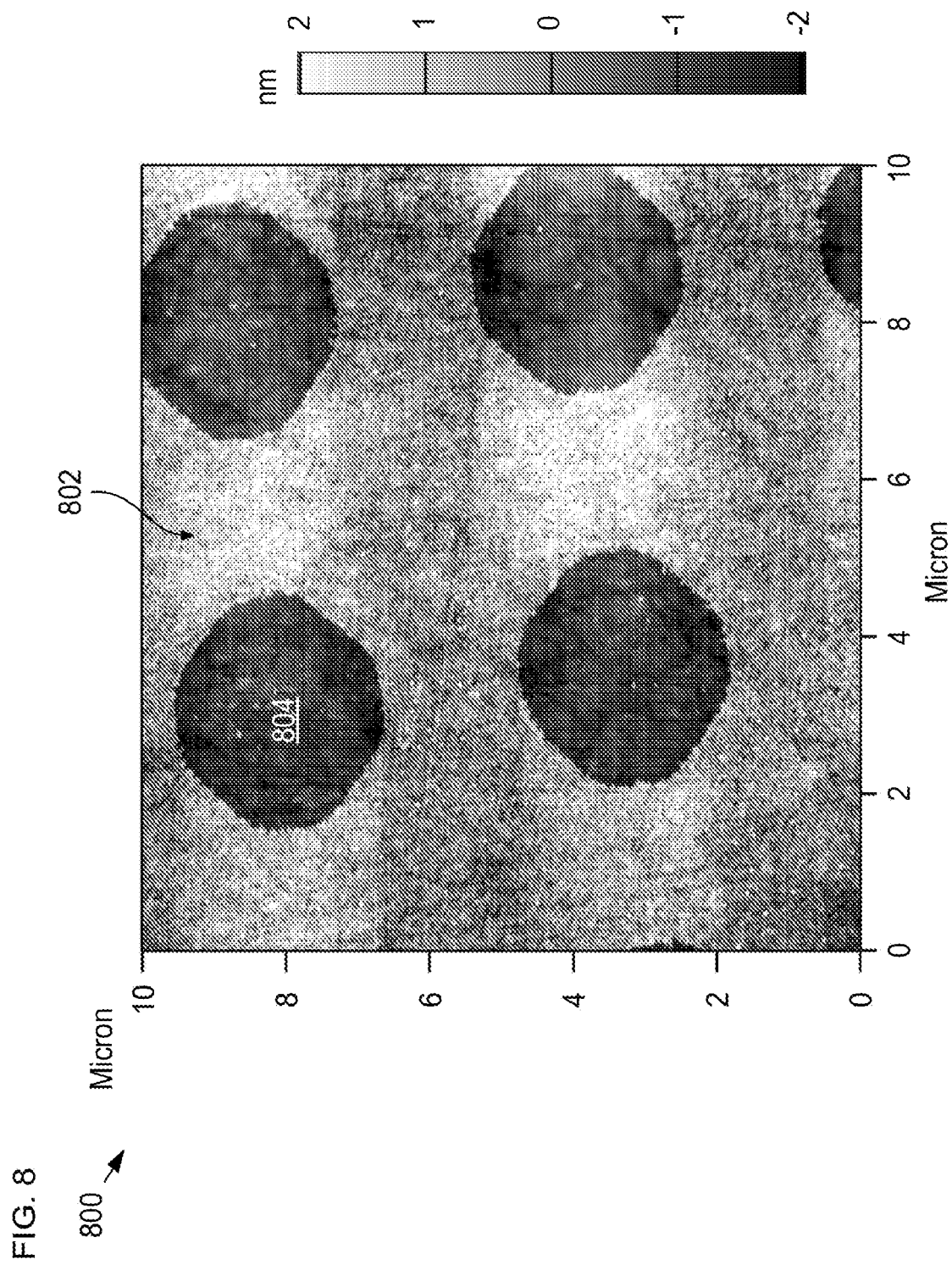
FIG. 8 depicts a top view of a patterned germanium layer on a substrate.

FIG. 8 depicts a top view of a patterned germanium layer on a substrate. Germanium layer 800 includes SAM layer 802 and exposed substrate regions 804. Germanium layer 800 is representative of a substrate that has been functionalized in select regions by the formation of a patterned SAM layer formed as described above.

It should be noted that the germanium-based lift-off process described herein can be extended to any silane or self-assembled monolayer. A flat SAM boundary is produced by methods in accordance with the present invention, in contrast to those produced via etching, as in the prior art, which typically leads to poor lateral resolution. In fact, one skilled in the art will recognize, after reading this Specification, that lift-off processes in accordance with the present invention can be used for virtually any chemical functionalization of a surface or material deposition on a surface.

The present invention also represents an improvement over the deposition of thiolated SAMs on patterned gold on silica wafers, as known in the prior art. Compared to a patterned gold film deposited by physical vapor deposition and functionalized with thiols, methods in accordance with the present invention are superior in terms of flatness where a minimum gold layer thickness of several nanometers is required for a continuous film. Embodiments of the present invention exploit this flatness to use the ODTS SAM as a substrate, which enables further biomolecule processing on the surface by the deposition of a supported lipid bilayer.

For example, the deposition of lipids directly onto a silica surface after germanium patterning of a hydrophobic alkanesilane layer enables a sharp and continuous interface between a supported lipid bilayer and a lipid monolayer formed over a hydrophobically patterned region, known as a "hybrid" lipid bilayer. Critically, prior-art methods of SAM patterning with respect to lipid functionalization have either failed to produce continuous and freely diffusing lipid layers or have been limited in their resolution and general applicability to a variety of surface modifications.

While supported-hybrid lipid bilayers have been previously demonstrated to selectively localize different membrane lipids, lipid bilayers in accordance with the present invention enable localization of different membrane proteins and form electrically tight seals without the need for a large area supported bilayer to block ionic leakage. By using germanium as a physical deposition mask, flat, superior SAM layers are achieved to create these supported-hybrid bilayers.

At operation 509, biomolecular regions 614 are formed on the functionalized regions of surface 604 (i.e. the remaining regions of SAM layer 612). In the depicted example, biomolecular regions 614 are formed by depositing small unilammelar vesicles (SUV) of a phosphatidylcholine (e.g., POPC from Avanti Lipids, etc.) onto the alkanesilane-functionalized silica surface of the substrate.

FIG. 6C depicts device 600 after the formation of biomolecular regions 614.

Figure 9:
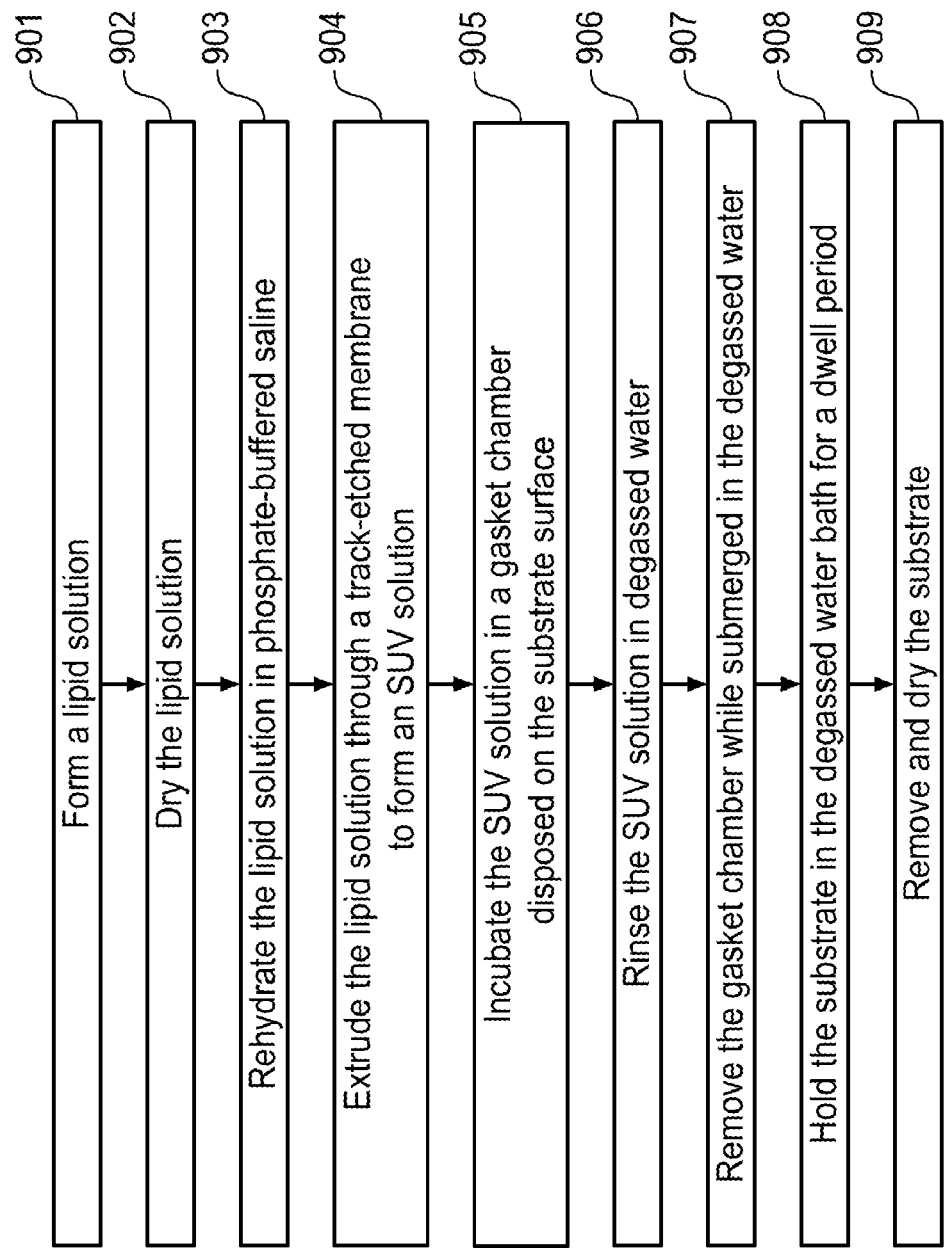
FIG. 9 depicts sub-operations of an exemplary sub-method suitable for forming small unilammelar vesicles on a functionalized surface.

FIG. 9 depicts sub-operations of an exemplary sub-method suitable for forming small unilammelar vesicles on a functionalized surface. Operation 509 begins with sub-operation 901, wherein phosphatidylcholine is dissolved in chloroform with 1 weight-percent (wt %) phospholipid (e.g., Oregon Green DHPE) to form a lipid solution.

At sub-operation 902, the lipid solution is dried on a glass vial under a nitrogen stream and then dried further under vacuum for at least 2 hours.

At sub-operation 903, the lipid solution is rehydrated in phosphate-buffered saline at a concentration of 1 mg/ml.

At sub-operation 904, the lipid solution is extruded multiple times (e.g., >20) through a 100-nm pore track-etched membrane to create an SUV solution.

At sub-operation 905, the SUV solution is incubated for 5 minutes within a gasket chamber (e.g., a Coverwell™ chamber) disposed on the substrate surface.

At sub-operation 906, the SUV solution is rinsed by water that has been degassed to promote desorption of excess stuck vesicles.

At sub-operation 907, the gasket chamber is removed while submerged in the bath of degassed water.

At sub-operation 908, the substrate is allowed to dwell for several hours in the water bath to enable excess vesicles to desorb.

At sub-operation 909, the chip is removed from the water bath and dried. Preferably, to remove the substrate from the bath, a coverslip is placed over its top to trap a thin layer of water between the coverslip and chip during removal.

For ease of imaging and long-term storage, the substrate is typically mounted on a coverslip whose edges are then sealed.

Because germanium can be completely cleared from a surface upon which it has been disposed, the present invention provides a patterned quartz surface that can support the formation of supported lipid bilayers and/or hybrid POPC monolayer/OTS monolayer regions. To demonstrate this capability, lipid mobility was measured by fluorescence recovery after photobleaching, taken on the DHPE-doped POPC lipids formed as described above.

The present invention affords significant advantages over prior-art ultraviolet-patterning techniques vis-à-vis supported bilayer/hybrid bilayer interfaces. First, the present invention enables the formation of dots having high spatial resolution of fluorescence with a clear fluorescent border between the supported and hybrid bilayer regions without noticeable defects. Second, the present invention enables a supported hybrid interface that is continuous. Third, using the techniques of the present invention, fluorescence recovery after photobleaching of a small hexagon is rapid and complete for isolated hexagons of supported bilayer. In contrast, if the interface is discontinuous and lipid diffusion between supported and hybrid regions is blocked, the hexagons remain dark after the hybrid layer has recovered. A continuous supported-hybrid bilayer has previously been demonstrated for PDMS stamping methods; however, this continuity was shown to depend on the baking time for transfer of the stamped PDMS layer. This is likely due to the thin PDMS "lip" that exists using the prior-art PDMS stamping method, which prevents highly hydrophobic functionalizations from forming a continuous junction.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for forming a device that includes an organic-material layer having a first pattern, the method comprising:
   defining the first pattern in a first layer comprising a first material that includes germanium;
   transferring the first pattern into a second layer comprising a second material that includes the organic material; and
   removing the first layer by dissolving it in water.

2. The method of claim 1 wherein the first pattern is defined in the first layer such that it includes at least one feature that is less than or equal to ten microns.

3. The method of claim 1 wherein the first pattern is defined in the first layer by operations comprising:
   forming the first layer as a full surface film disposed on the second layer;
   forming a microlithographic mask on the first layer;
   defining a second pattern in the microlithographic mask, wherein the second pattern includes at least one first region disposed on the first layer, the at least one first region having the first pattern, and wherein the second pattern exposes the first layer in at least one second region; and
   exposing the first layer to water in the at least one second region.

4. The method of claim 3 wherein the first pattern is transferred into the second layer by etching the second material through the at least one second region, and wherein the removal of the first layer removes the at least one first region.

5. The method of claim 1 wherein the first pattern is defined in the first layer by operations comprising:
   forming a microlithographic mask on a first surface of a substrate;
   defining a second pattern in the microlithographic mask, wherein the second pattern includes at least one first region disposed on the first surface, the at least one first region having the first pattern, and wherein the second pattern exposes the first surface in at least one second region; and
   forming the first layer over the microlithographic mask such that first material is disposed on photoresist in the at least one first region and disposed on the first surface in the at least one second region; and
   removing the microlithographic mask such that the photoresist and the first material are removed from the at least one first region and the first material remains in the at least one second region.

6. The method of claim 5 wherein the first pattern is transferred into the second layer by operations comprising:
depositing the second layer over the first layer such that the second material is in contact with the first surface in the at least one first region and disposed on the first layer in the at least one second region; and
removing the second material from the at least one second region, wherein the second material is removed from the at least one second region when the first layer is dissolved in water.

7. The method of claim 1 wherein the device is formed as an organic electrochemical transistor (OECT) having a source, drain, and gate, and wherein the method further comprises:
forming a third layer comprising a dielectric material;
forming first and second electrodes on the dielectric material, wherein the first and second electrodes define the source and drain, and wherein the first and second electrodes are formed such that they are separated by a gap; and
forming the second layer such that it is disposed within the gap such that the second material is operative as the channel of the OECT;
wherein the transfer of the first pattern into the second layer defines the gate such that the gate includes the channel.

8. The method of claim 7 wherein the second layer is formed such that the second material comprises poly(3,4-ethylenedioxythiophene):poly(styrenesulfonate).

9. The method of claim 7 further comprising:
forming an electrolyte disposed on the gate; and
forming a gate electrode that is electrically coupled with the gate through the electrolyte.

10. The method of claim 1 wherein the organic material is an organic semiconductor.

11. The method of claim 1 wherein the organic material is a self-assembled monolayer (SAM).

12. The method of claim 11 wherein the SAM comprises silane.

13. The method of claim 1 wherein the organic material is a light-emitting organic material.

14. The method of claim 13 wherein the light-emitting organic material is selected from the group consisting of organometallic chelates, fluorescent dyes, phosphorescent dyes, and conjugated dendrimers.

15. The method of claim 1 wherein the first layer consists of the first material and the first material consists of germanium.

16. The method of claim 1 further comprising forming the second layer such that the second material comprises poly(3,4-ethylenedioxythiophene):poly(styrenesulfonate).

17. A method for forming a device that includes an organic-material layer having a first pattern, the method comprising:
providing a substrate having a dielectric layer that comprises a first surface;
forming first and second electrodes on the first surface, wherein the first and second electrodes are separated by a gap;
forming a first layer comprising a first material that includes the organic material, wherein the first layer is formed such that the first material resides within the gap;
forming a second layer comprising a second material that includes germanium;
patterning the second layer to define a second pattern;
transferring the second pattern into the first layer, wherein the transfer of the second pattern into the first layer defines the first pattern in the first layer; and
removing the second material by exposing it to water.

18. The method of claim 17 wherein the first layer is formed such that the first material comprises poly(3,4-ethylenedioxythiophene):poly(styrenesulfonate).

19. The method of claim 17 wherein the first pattern and the second pattern are the same pattern.

20. The method of claim 17 wherein the first pattern is the inverse of the second pattern.

21. The method of claim 17 further comprising:
forming an electrolyte disposed on the first material residing in the gap; and
forming a third electrode that is electrically coupled with the first material through the electrolyte.

22. The method of claim 17 wherein the first material includes an organic semiconductor.

23. The method of claim 17 wherein the first material is a self-assembled monolayer (SAM).

24. The method of claim 23 wherein the SAM comprises silane.

25. The method of claim 17 wherein the first pattern includes at least one feature that is less than or equal to one micron.

* * * * *